(12) United States Patent
Tamura

(10) Patent No.: US 12,154,811 B2
(45) Date of Patent: *Nov. 26, 2024

(54) MOUNTING DEVICE AND MOUNTING METHOD

(71) Applicant: TORAY ENGINEERING CO., LTD., Tokyo (JP)

(72) Inventor: Yasushi Tamura, Otsu (JP)

(73) Assignee: TORAY ENGINEERING CO., LTD., Tokyo (JP)

( * ) Notice: Subject to any disclaimer, the term of this patent is extended or adjusted under 35 U.S.C. 154(b) by 667 days.

This patent is subject to a terminal disclaimer.

(21) Appl. No.: 17/381,823

(22) Filed: Jul. 21, 2021

(65) Prior Publication Data

US 2021/0351057 A1 Nov. 11, 2021

Related U.S. Application Data

(63) Continuation of application No. PCT/JP2020/001153, filed on Jan. 16, 2020.

(30) Foreign Application Priority Data

Jan. 23, 2019 (JP) .................... 2019-008997
Jan. 23, 2019 (JP) .................... 2019-009086

(51) Int. Cl.
*H01L 21/68* (2006.01)
*H01L 21/67* (2006.01)
(Continued)

(52) U.S. Cl.
CPC ...... *H01L 21/681* (2013.01); *H01L 21/67144* (2013.01); *H01L 24/75* (2013.01);
(Continued)

(58) Field of Classification Search
CPC ............ H01L 21/681; H01L 21/67144; H01L 23/544; H01L 2223/54426; H01L 2223/54486
(Continued)

(56) References Cited

FOREIGN PATENT DOCUMENTS

| JP | 2017-208522 A | 11/2017 | |
| JP | 2018-56481 A | 4/2018 | |
| WO | WO-03041478 A1 * | 5/2003 | ......... H05K 13/0812 |

OTHER PUBLICATIONS

International Search Report of the corresponding International Application No. PCT/JP2020/001153, dated Feb. 25, 2020.

* cited by examiner

*Primary Examiner* — Igwe U Anya
(74) *Attorney, Agent, or Firm* — Global IP Counselors, LLP

(57) ABSTRACT

A mounting device and a mounting method is provided with which, after lowering a mounting head holding a chip component in a direction perpendicular to a substrate to bring the chip component into close contact with the substrate subsequent to positioning the chip component and the substrate, a control unit causes a recognition mechanism to start a parallel recognition operation of a chip recognition mark and a substrate recognition mark and recognize the chip recognition mark and the substrate recognition mark through the mounting head in a mounted state in which the chip component is in close contact with the substrate, and calculates mounting position accuracy of the chip component and the substrate.

8 Claims, 11 Drawing Sheets

(51) Int. Cl.
*H01L 23/00* (2006.01)
*H01L 23/544* (2006.01)
(52) U.S. Cl.
CPC .. *H01L 23/544* (2013.01); *H01L 2223/54426* (2013.01); *H01L 2223/54486* (2013.01); *H01L 2224/75702* (2013.01); *H01L 2224/75745* (2013.01); *H01L 2224/75753* (2013.01); *H01L 2224/75901* (2013.01)
(58) Field of Classification Search
USPC .......................................................... 438/7
See application file for complete search history.

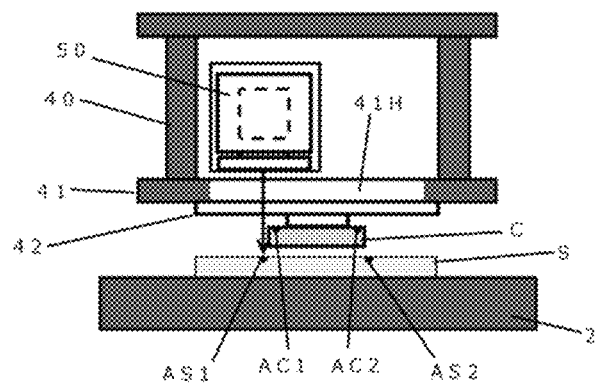
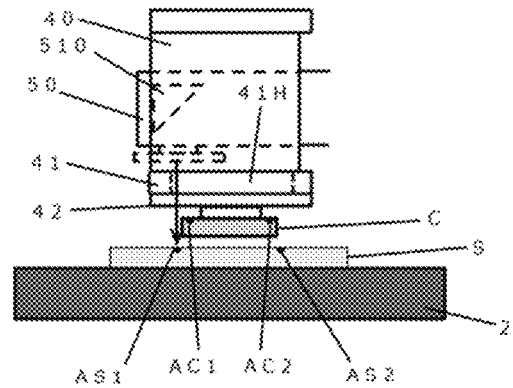
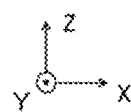
FIG. 3A
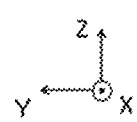
FIG. 3B
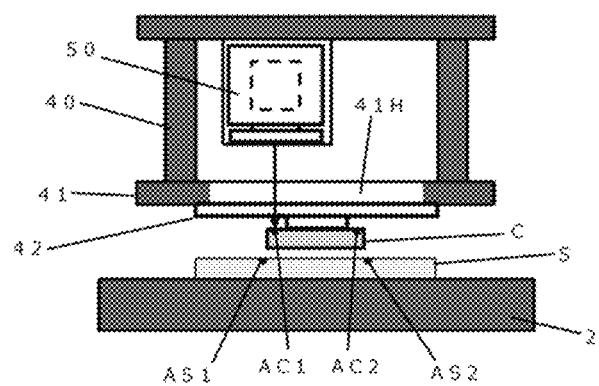
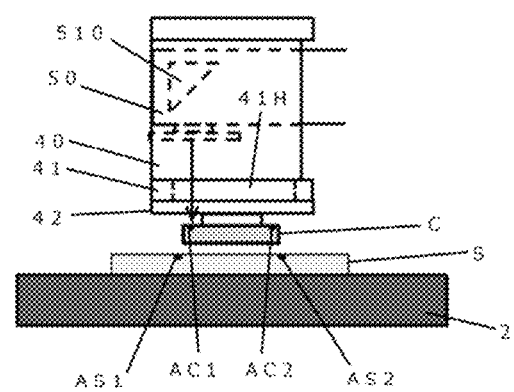
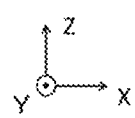
FIG. 4A
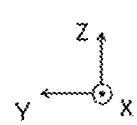
FIG. 4B

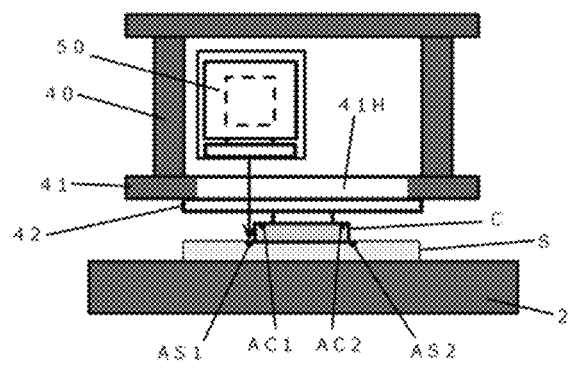
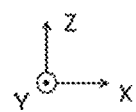
FIG. 9A
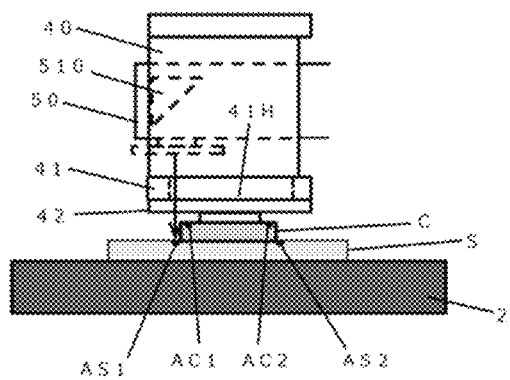
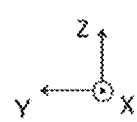
FIG. 9B
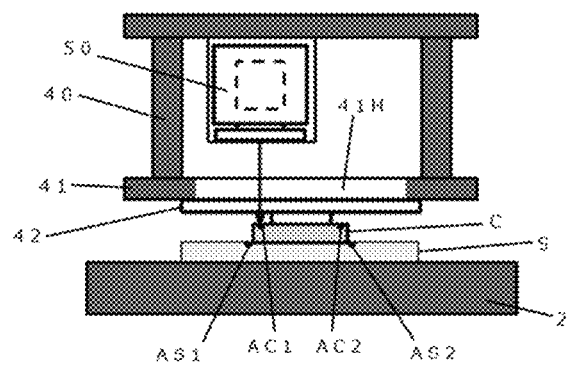
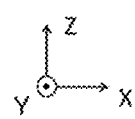
FIG. 10A
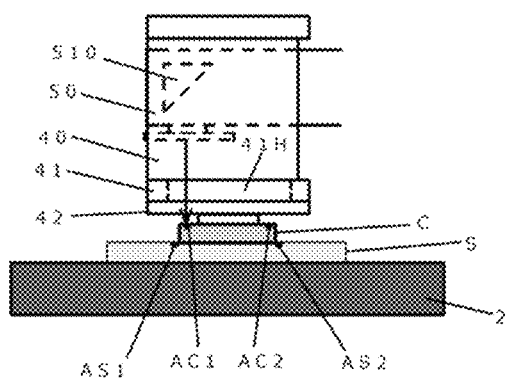
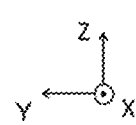
FIG. 10B

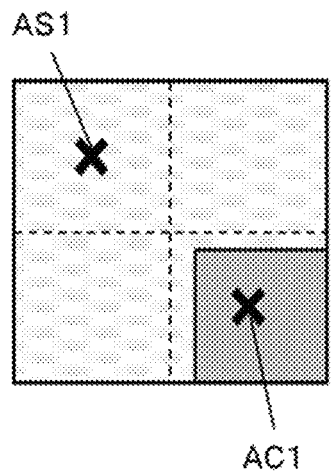
FIG. 13
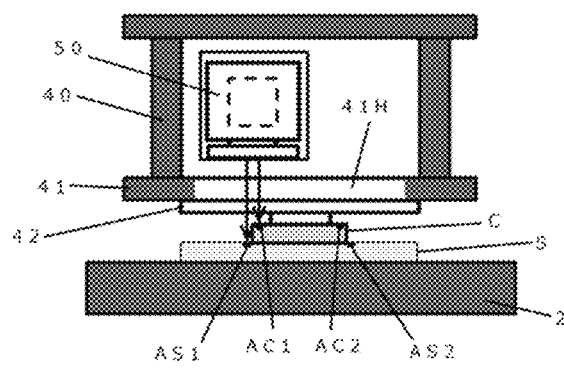
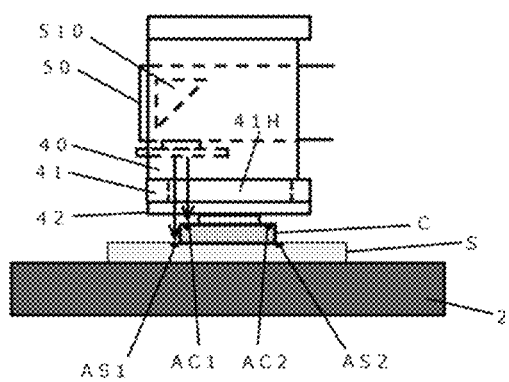
FIG. 14A
FIG. 14B

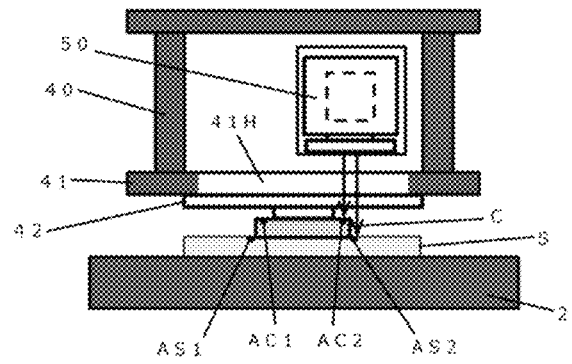
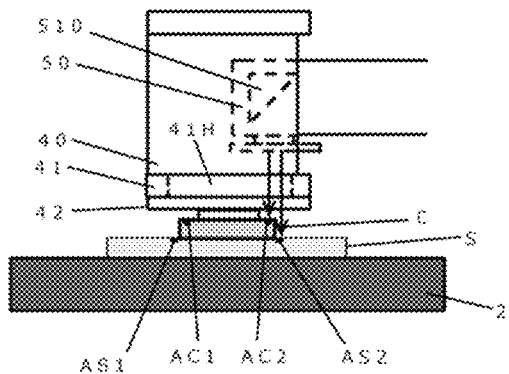
FIG. 15A              FIG. 15B
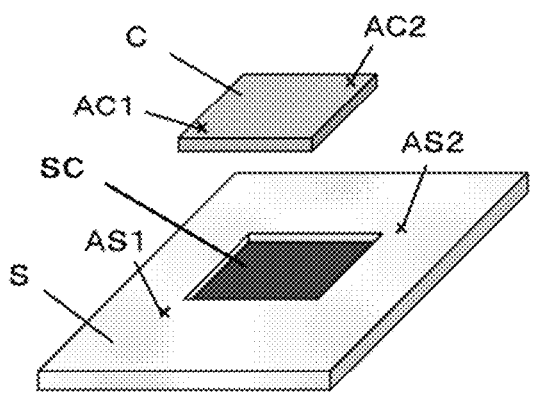
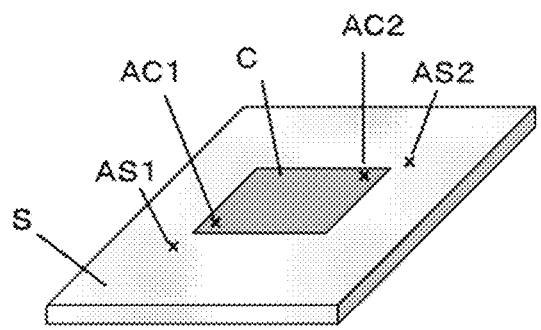
FIG. 16A              FIG. 16B

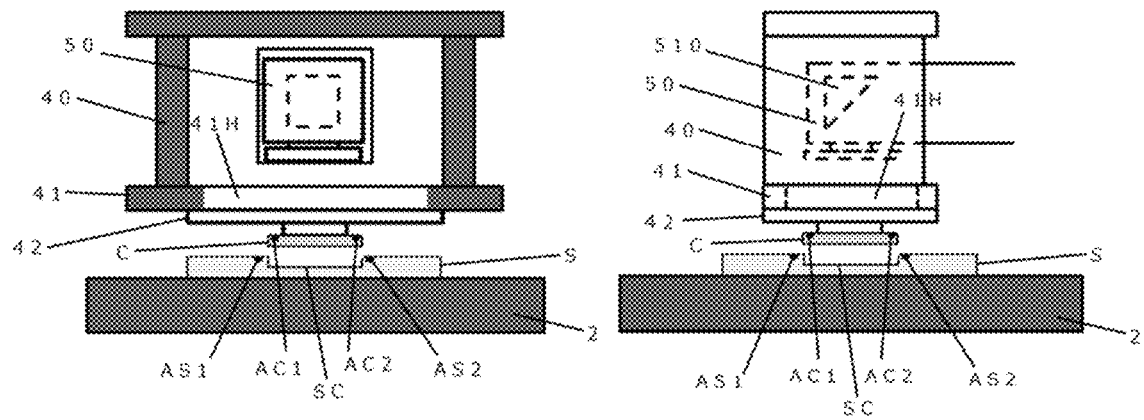
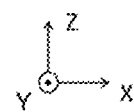 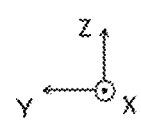
*FIG. 17A*      *FIG. 17B*
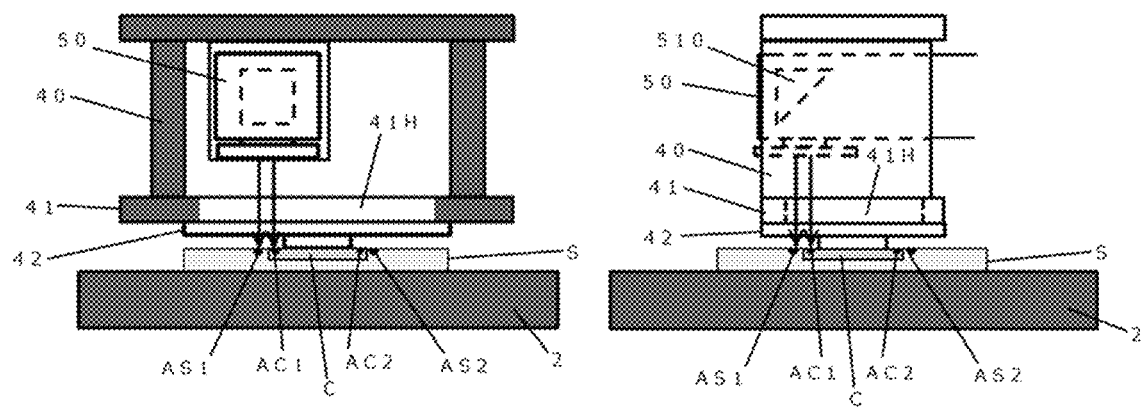
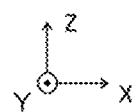 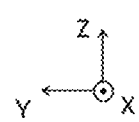
*FIG. 18A*      *FIG. 18B*

MOUNTING DEVICE AND MOUNTING METHOD

CROSS-REFERENCE TO RELATED APPLICATIONS

This application is a continuation application of PCT International Application No. PCT/JP2020/001153 filed on Jan. 16, 2020, which claims priority to Japanese Patent Application Nos. 2019-009086 filed on Jan. 23, 2019 and 2019-008997 filed on Jan. 23, 2019. The entire disclosures of PCT International Application No. PCT/JP2020/001153 and Japanese Patent Application Nos. 2019-009086 and 2019-008997 are hereby incorporated herein by reference.

BACKGROUND

Field of the Invention

The present invention relates to a mounting device and a mounting method for mounting a chip component on a substrate. In particular, the present invention relates to a mounting device and a mounting method for performing face-up mounting in which the electrode surface of the substrate and the electrode surface of the chip component face in the same direction.

Background Information

Two well-known mounting forms for mounting a semiconductor chip or other such chip component on a wiring substrate or other such substrate include face-down mounting, in which the electrode surface of the chip component is mounted facing the electrode surface of the substrate, and face-up mounting, in which the electrode surface of the substrate and the electrode surface of the chip component are mounted facing in the same direction.

In both of these mounting forms, highly accurate positioning is required for mounting the chip component at the specified position on the substrate, and recognition marks for positioning are made on the chip component and the substrate. Here, the reason for positioning the chip component at a specific position on the substrate is so that there will be a specific level of accuracy in the positional relationship between the electrodes of the substrate and the electrodes of the chip component, and with both face-down mounting and face-up mounting, the recognition mark position is generally disposed on the substrate and the chip component by using the electrode position as a reference, and the marks are made on the electrode surface side where the relative position is clear.

FIGS. 22A and 22B show an example of face-up mounting. As shown in FIG. 22A, a chip component C is generally given two chip component recognition marks (hereinafter referred to as a chip recognition mark), namely, a chip recognition first mark AC1 and a chip recognition second mark AC2 (These are disposed diagonally opposite each other in the example of FIG. 22A) Meanwhile, a substrate S is generally given two substrate recognition marks, namely, a substrate recognition first mark AS1 and a substrate recognition second mark AS2. (These are disposed diagonally opposite each other in the example of FIG. 22A.) In view of this, in positioning, the misalignment (the position and angle in the in-plane direction of the substrate) with respect to the specified mounting position is found from the positional relationships between the chip recognition first mark AC1 and the substrate recognition first mark AS1, and between the chip recognition first mark AC2 and the substrate recognition second mark AS2, and the relative position is corrected before mounting (FIG. 22B).

In both face-down mounting and face-up mounting, a chip component held by the mounting head and from above is mounted by being press-fitted onto a substrate. Accordingly, in face-down mounting in which the electrodes of the substrate and the chip component are opposite each other, there is a known a method in which the substrate recognition mark and the chip recognition mark are directly observed at the same time by using an upper and lower two-field camera. On the other hand, in face-up mounting in which the electrodes of the substrate and the chip component are mounted facing in the same direction, the electrode surface of the chip component is in close contact with the mounting head, so a method has been proposed in which each recognition mark can be observed through the mounting head by using a transparent member for the portion of the mounting head that holds the chip component, for example, so that the recognition mark of the chip component can be directly observed (see International Publication No. 2003/041478 (Patent Literature 1) and Japanese Patent Application Publication No. 2017-208522 (Patent Literature 2), for example).

SUMMARY

Semiconductor components have made tremendous strides in terms of increasing their density, adding more electrodes, and narrowing their pitch, and there is a need for a mounting device with which positioning can be performed more accurately than in the past, without a significant cost increase or a decrease in productivity, and from the standpoint of quality control, all mounting position accuracy measurements and inspections need to be performed in the mounted state. However, Patent Literature 2 does not even mention mounting position accuracy measurement and inspection in a mounted state.

Also, measuring the mounting position accuracy with a device separate from the mounting device after the mounting step is complete has the problem of increasing the cost, and another problem is that when a defect in the mounting position accuracy occurs, it takes time to notice this, so corrective action is delayed.

The present invention was conceived of in view of the above problems, and provides a mounting device and a mounting method with which accurate mounting can be achieved, without an increase in cost or a decrease in productivity, in face-up mounting in which the electrode surface of the substrate and the electrode surface of the chip component face in the same direction.

In view of the state of the known technology and in accordance with a first aspect of the present disclosure,
 a mounting device is provided for face-up mounting of a chip component having a positioning-use chip recognition mark and a substrate having a positioning-use substrate recognition mark, in an orientation in which the chip recognition mark and the substrate recognition mark are facing up, the mounting device comprising:
 a substrate stage configured to hold the substrate;
 a mounting head configured to hold the chip component;
 an elevator configured to raise and lower the mounting head in a direction perpendicular to the substrate;
 a recognition mechanism configured to recognize the chip recognition mark and the substrate recognition mark through the mounting head and from above the mounting head, the recognition mechanism being movable in an in-plane direction of a substrate surface of the substrate; and a control unit connected to the recognition mechanism, the control unit being configured to calculate an amount of misalignment between the chip component and the substrate from position information about the chip recognition mark and the substrate recognition mark obtained from the recognition mechanism, and configured to performing positioning by driving the mounting head and/or the substrate stage according to the amount of misalignment, after lowering the mounting head holding the chip component in the direction perpendicular to the substrate to bring the chip component into close contact with the substrate subsequent to positioning the chip component and the substrate by the recognition mechanism, the control unit being configured to cause the recognition mechanism to start a parallel recognition operation of the chip recognition mark and the substrate recognition mark and recognize the chip recognition mark and the substrate recognition mark through the mounting head in a mounted state in which the chip component is in close contact with the substrate, and configured to calculate mounting position accuracy of the chip component and the substrate.

In accordance with a second aspect of the present disclosure, with the mounting device according to the first aspect, during the parallel recognition operation of the chip recognition mark and the substrate recognition mark through the mounting head for calculating the mounting position accuracy that has been started after the chip component is brought into close contact with the substrate, the recognition mechanism is configured to simultaneously recognize the chip recognition mark and the substrate recognition mark while a center of an optical axis of the recognition mechanism is disposed at a position near a midpoint between the chip recognition mark and the substrate recognition mark.

In accordance with a third aspect of the present disclosure, with the mounting device according to the second, the control unit is configured to feed back a calculation result of the mounting position accuracy to a mounting position to automatically calibrate and adjust the mounting position.

In view of the state of the known technology and in accordance with a fourth aspect of the present disclosure, a mounting device is provided for face-up mounting of a chip component having a positioning-use chip recognition mark and a substrate having a positioning-use substrate recognition mark, in an orientation in which the chip recognition mark and the substrate recognition mark are facing up, the mounting device comprising:

a substrate stage configured to hold the substrate;

a mounting head configured to hold the chip component and press-bonds the chip component to the substrate;

an elevator configured to raise and lower the mounting head in a direction perpendicular to the substrate; and a recognition mechanism configured to recognize the chip recognition mark and the substrate recognition mark through the mounting head and from above the mounting head, the recognition mechanism being movable in an in-plane direction of a substrate surface of the substrate, the mounting head having a chip holding unit that is configured to hold the chip component and is made of a translucent material, the chip holding unit having a through-hole for recognizing the chip recognition mark and the substrate recognition mark.

In accordance with a fifth aspect of the present disclosure, with the mounting device according to the fourth aspect, the chip holding unit is made of glass or ceramic and has a transmittance of visible light and infrared light of at least 50% at a thickness of 1 mm.

In view of the state of the known technology and in accordance with a sixth aspect of the present disclosure, a mounting method is provided in which a chip component having a positioning-use chip recognition mark is mounted on a substrate having a positioning-use substrate recognition mark, the method comprising:

positioning relative positional relation between the chip component and the substrate by recognizing, in a state where the chip component is disposed with a gap between itself and the substrate, the chip recognition mark and the substrate recognition mark from a same direction through a mounting head;

mounting by bringing the chip component into close contact with the substrate and pressing; and measuring and inspecting mounting position accuracy by recognizing, in a mounted state in which the chip component is in close contact with the substrate, the chip recognition mark and the substrate recognition mark from the same direction through the mounting head, and by calculating the relative positional relation between the chip component and the substrate, after the chip component is in close contact with the substrate, the mounting and the measuring and inspecting of the mounting position accuracy being performed in parallel.

In accordance with a seventh aspect of the present disclosure, with the mounting method according to the sixth aspect, during the measuring and inspecting of the mounting position accuracy, the chip recognition mark and the substrate recognition mark are simultaneously recognized while a center of an optical axis of a recognition mechanism is disposed at a position near a midpoint between the chip recognition mark and the substrate recognition mark.

In accordance with an eighth aspect of the present disclosure, the mounting method according to the seventh aspect further comprises feeding back a calculation result of the mounting position accuracy calculated during the measuring and inspecting of the mounting position accuracy to a mounting position to automatically calibrate and adjust the mounting position.

The present invention makes it possible to realize a mounting device and a mounting method with which mounting can be performed stably and accurately, for all mounting position accuracy measurements and inspections in the mounting device, without an increase in cost or a decrease in productivity, in face-up mounting in which the electrode surface of the substrate and the electrode surface of the chip component face in the same direction. In other words, the present invention makes it possible to provide a mounting device and a mounting method with which, in face-up mounting in which the electrode surface of a substrate and the electrode surface of a chip component both face in the same direction, stable and highly accurate mounting, and measurement and inspection of the accuracy of all mounting positions in the mounting device can be performed without increasing the cost or reducing productivity.

BRIEF DESCRIPTION OF THE DRAWINGS

FIGS. 3A and 3B illustrate a state in which the mounting device according to an embodiment of the present disclosure acquires position information about a substrate first recognition mark during the positioning of a chip component and a substrate;

FIGS. 4A and 4B illustrate a state in which the mounting device according to an embodiment of the present disclosure acquires position information about a chip first recognition mark during the positioning of a chip component and a substrate;

FIGS. 9A and 9B illustrate the measurement of mounting accuracy in a state where the mounting head is lowered and the chip component is in close contact with the substrate in a mounting step of mounting a chip component on a substrate with the mounting device according to the embodiment of the present disclosure, and show a state in which position information about a substrate first recognition mark is being acquired;

FIGS. 10A and 10B illustrate the measurement of mounting accuracy in a state where the mounting head is lowered and the chip component is in close contact with the substrate in a mounting step of mounting a chip component on a substrate with the mounting device according to the embodiment of the present disclosure, and show a state in which position information about a chip first recognition mark is being acquired;

FIG. 13 illustrates mounting accuracy measurement at the mounting step stage at which a chip component is mounted on a substrate with the mounting device according to an embodiment of the present disclosure, and shows an image example of an imaging means that has acquired position information about the substrate first recognition mark and the chip first recognition mark simultaneously in the same visual field when mounting accuracy measurement is performed;

FIGS. 14A and 14B illustrate mounting accuracy measurement in a state where the mounting head is lowered and the chip component is in close contact with the substrate in the mounting step of mounting a chip component on a substrate with the mounting device according to an embodiment of the present disclosure, and show a state in which position information about the substrate first recognition mark and the chip first recognition mark are acquired simultaneously;

FIGS. 15A and 15B illustrate mounting accuracy measurement in a state where the mounting head is lowered and the chip component is in close contact with the substrate in the mounting step of mounting a chip component on a substrate with the mounting device according to an embodiment of the present disclosure, and show a state in which position information about the substrate second recognition mark and the chip second recognition mark are acquired simultaneously;

FIGS. 16A and 16B illustrate face-up mounting on an embedded substrate, with FIG. 16A showing a state in which the chip component is separated from the substrate, and FIG. 16B showing a state in which the chip component is positioned and mounted on the substrate;

FIGS. 17A and 17B show a state when the embedded substrate and the chip component are positioned with the mounting device according to the embodiment of the present disclosure;

FIGS. 18A and 18B illustrate mounting accuracy measurement in a state where the mounting head is lowered and the chip component is in close contact with the substrate in the mounting step of mounting a chip component on an embedded substrate with the mounting device according to an embodiment of the present disclosure, and show a state in which position information about the substrate first recognition mark and the chip first recognition mark are acquired simultaneously;

DETAILED DESCRIPTION OF EMBODIMENTS

Figures 1A, 1B:
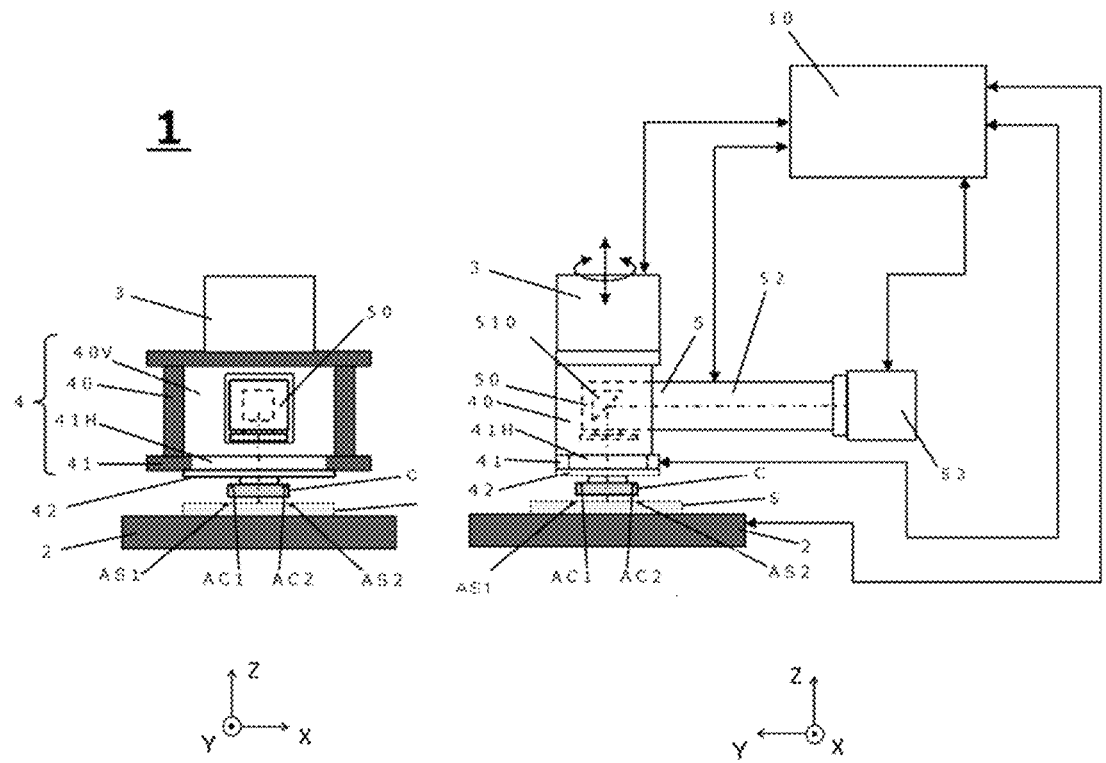
FIG. 1A is a diagram of the appearance of the mounting device according to an embodiment of the present disclosure.
FIG. 1B is a diagram showing the appearance and the constituent elements of this mounting device as viewed from another angle.

An embodiment of the present disclosure will be described with reference to the drawings. FIG. 1A shows the appearance of a mounting device 1 in an embodiment of the present disclosure, and FIG. 1B is an external view as seen from a different angle from that in FIG. 1A, and also shows the constituent elements including a control system.

The mounting device 1 is a device for face-up mounting by positioning a chip component C (e.g., an electronic circuit or integrated circuit) on a substrate S, in which a chip recognition first mark AC1 and a chip recognition second mark AC2 made on the chip component C, and a substrate recognition first mark AS1 and a substrate recognition second mark AS2 made on the substrate are used for positioning. More specifically, the chip component C is mounted on the substrate S after the positional relationship between the chip recognition first mark AC1 and the substrate recognition first mark AS1, and the positional relationship between the chip recognition second mark AC2 and the substrate recognition second mark AS2 have been corrected to within an allowable range.

The chip component C is generally mounted on the substrate S via a thermosetting adhesive. The thermosetting adhesive is usually provided on the opposite side from the electrode surface of the chip component C (the surface with the chip recognition marks), but may instead be provided on the substrate S side.

The mounting device 1 includes as constituent elements a substrate stage 2, an elevating and pressing unit 3 (e.g., an elevator), a mounting head 4, a recognition mechanism 5, and a control unit 10.

The substrate stage 2 has a function of holding the substrate S and moving the substrate S in the in-plane direction (within the XY plane). Here, vacuum chucking is suitable for holding the substrate S, but the present disclosure is not limited to this, and an electrostatic chucking method may be employed instead.

The elevating and pressing unit 3 (e.g., the elevator) has a function of moving the mounting head 4 in the direction perpendicular to the substrate S (Z direction), and a function of adjusting the pressing force on the chip component C via the mounting head 4, and preferably has a function of adjusting the angle by which the mounting head 4 rotates around the axis in the Z direction. In the illustrated embodiment, the elevating and pressing unit 3 includes an electronic actuator or an electronic motor, for example.

The mounting head 4 holds the chip component C and press fits it to the substrate S. The mounting head 4 includes as constituent elements a head body 40, a heater unit 41 (e.g., a heater), and an attachment tool 42. The head main body 40 is linked to the elevating and pressing unit 3, and the heater portion 41 is held and disposed on the lower side. The heater unit 41 has a heat generating function, and is used to heat the chip component C via the attachment tool 42. The heater unit 41 also has a function of using a decompression flow path (not shown) to hold the attachment tool 42 by suction. The attachment tool 42 is a chip holding unit (e.g., a chip holder) that holds the chip component C by suction, is selected to match the shape of the chip component C, and is held to the heater unit 41 by suction.

In the present disclosure, the substrate recognition marks and the chip recognition marks are observed through the mounting head 4. Therefore, in this embodiment, the attachment tool 42 is made of a transparent member. The heater unit 41 needs either to be formed of a transparent member or provided with an opening so that the substrate recognition marks and the chip recognition marks can be observed, and in this embodiment, a through-hole 41H is provided. Here, through-holes 41H may be provided to match the positions of the individual substrate recognition marks and chip recognition marks, but it is preferable to use a hole shape that can accommodate the entire dimensional specification range since the part will not have to be replaced depending on the shape of the chip component. Also, the mounting head 4 needs a space into which an image capture unit 50 for observing the substrate recognition marks and the chip recognition marks can enter, and in this embodiment, a head space 40V is provided as shown in FIGS. 1A and 1B. That is, in the mounting device 1 in FIGS. 1A and 1B, the head main body 40 has a structure made up of side plates and a top plate, provided on the heater portion 41.

The recognition mechanism 5 is used to acquire position information by recognizing the positions of the substrate recognition marks and the chip recognition marks through the mounting head 4, via the attachment tool 42 and the heater unit 41. In this embodiment, the recognition mechanism 5 includes as constituent elements the image capture unit 50, an optical system 52, and an imaging means 53 that is linked to the optical system 52. In the illustrated embodiment, the imaging means 53 includes an image sensor, such as a solid state image sensor (e.g., a CCD image sensor, a CMOS image sensor, and the like).

The image capture unit 50 is disposed at the upper part of the recognition target acquired by the imaging means 53, and accommodates the recognition target within the field of view. The image capture unit 50 has a function of changing the direction of the optical path by a reflecting means 510, and the optical system 52 has an optical lens and has a function of enlarging an image in order to obtain higher resolution. In the illustrated embodiment, the reflecting means 510 includes a mirror or reflector.

Also, the recognition mechanism 5 has a configuration capable of moving in the in-plane direction of the substrate S (and the chip component C) within the head space 40V by a drive mechanism (not shown). Furthermore, the recognition mechanism 5 is configured to be able to move in the direction perpendicular to the substrate S (Z direction) so that the focal position can be adjusted with respect to the recognition marks.

The mounting head 4 has a configuration that allows independent movement in the direction perpendicular to the substrate S (Z direction), and the head space 40V is designed to be small enough not to interfere with the recognition mechanism 5 that has entered the head space 40V even if the mounting head 4 moves in the vertical direction.

The control unit 10 controls the operation of the mounting device 1, and is connected to the substrate stage 2, the elevating and pressing unit 3, the mounting head 4, and the recognition mechanism 5.

The main constituent elements of the control unit 10 are essentially a CPU (Central Processing Unit) (e.g., an electronic controller or processor) and a memory device (e.g., a computer memory). The control unit 10 is connected to each device via an interface as needed, and if a program is installed, operations can be performed using acquired data, and it is also possible to perform output according to the operational results.

The control unit 10 is connected to the substrate stage 2 and has a function of controlling the holding and release of the substrate S by the substrate stage 2, and of controlling movement in the in-plane direction of the substrate S.

The control unit 10 is connected to the elevating and pressing unit 3 and has a function of controlling the drive of the mounting head 4 in the direction perpendicular to the substrate S (Z direction), rotational drive in the around the Z direction, and the pressing force.

The control unit 10 is connected to the mounting head 4 and has a function of holding and releasing the chip component C by suction of the attachment tool 42, and controlling the heating temperature of the heater unit 41.

The control unit 10 is connected to the recognition mechanism 5 and has a function of controlling drive in the in-plane direction of the substrate S (and the chip component C) and drive in the direction perpendicular to the substrate S (Z direction), as well as acquiring image data by controlling the imaging means 53. Furthermore, the control unit 10 has an image processing function, and has a function of finding the positions of recognition targets in an image acquired by the imaging means 53.

The process from the step of positioning the substrate S and the chip component C with the mounting device 1 shown in FIGS. 1A and 1B, to the mounting accuracy measurement and inspection step will now be described.

First, in the pre-positioning process, the control unit 10 holds the substrate S on the substrate stage 2 and holds the chip component C on the mounting head 4. The substrate S here is disposed within a specific range of the substrate stage 2, and the chip component C is held within a specific range of the attachment tool 42. That is, the chip component C and the substrate S are roughly positioned. Accordingly, the substrate recognition first mark AS1, the substrate recognition second mark AS2, the chip recognition first mark AC1, and the chip recognition second mark AC2 can all be observed through the mounting head 4 by looking through the through-hole 41H of the heater 41 and the attachment tool 42.

FIGS. 3A, 3B, 4A, 4B, 5A, 5B, 6A and 6B illustrate the positioning step, and are views showing the process of obtaining position information about the substrate recognition marks and the chip recognition marks.

First, FIGS. 3A and 3B show the process of acquiring position information about the substrate recognition first mark AS1 of the substrate S. Here, FIG. 3A is a diagram of the mounting device 1 viewed from the Y direction, and FIG. 3B is a diagram of the mounting device 1 viewed from the X direction (partially see-through view). The relationship shown in FIGS. 3A and 3B also applies to FIGS. 4A, 4B, 5A, 5B, 6A and 6B (furthermore, the same applies to FIGS. 7A, 7B, 8A, 8B, 9A, 9B, 10A, 10B, 11A, 11B, 12A and 12B, and FIGS. 14A, 14B, 15A, 15B, 17A, 17B, 18A, 18B, 19A and 19B).

Figure 2:
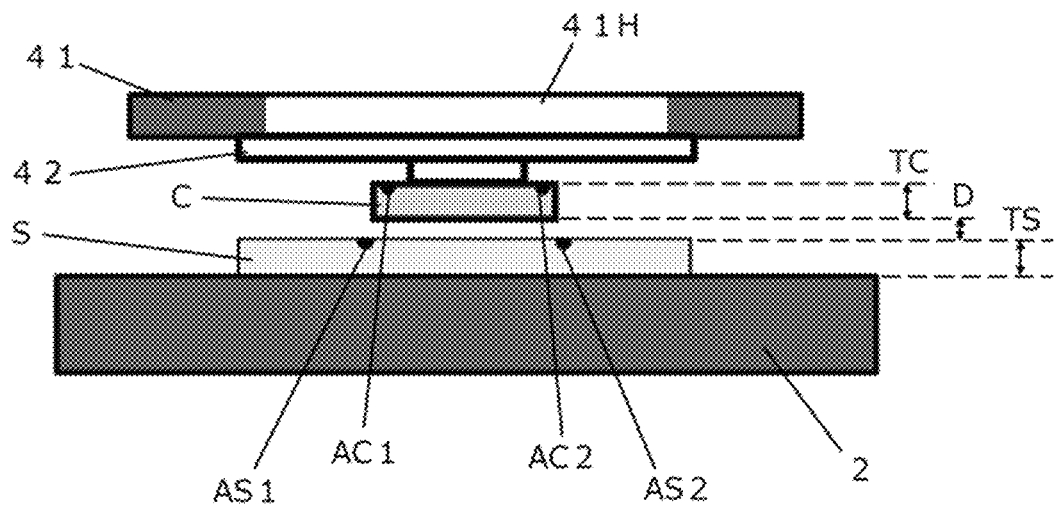
FIG. 2 is a diagram illustrating the positional relationship when positioning a chip component and a substrate with the mounting device according to an embodiment of the present disclosure.

FIGS. 3A and 3B show the state where the control unit 10 has lowered the mounting head 4 so that the chip component C is brought into close contact with the substrate S. In this state, as shown in FIG. 2, a gap D is ensured between the substrate S and the chip component C during positioning, this gap being large enough to allow the substrate S and the chip component C to move relative to each other in the in-plane direction without interfering with each other.

In FIGS. 3A and 3B, the control unit 10 controls the drive means (i.e., the electronic actuator or motor) so that the substrate recognition first mark AS1 is located near the center of the optical axis of the image capture unit 50 with respect to the recognition mechanism 5. In this state, the XY position information about the image capture unit 50 is stored in the control unit 10. Also, the control unit 10 controls the imaging means 53 to image the substrate recognition first mark AS1 in a focused state, and uses its image processing function to find XY position information about the substrate recognition first mark AS1 in the field of view, and store this information.

Next, the control unit 10 controls the drive means (i.e., the electronic actuator or motor) of the recognition mechanism 5 to move recognition mechanism 5 in the XY plane so that the chip recognition first mark AC1 will be located near the center of the field of view of the image capture unit 50 as shown in FIGS. 4A and 4B. During this time, since the distance from the image capture unit 50 to the chip recognition first mark AC1 is different from the distance to the substrate recognition first mark AS1, the image acquired by the imaging means 53 is out of focus. In view of this, in this embodiment, the recognition mechanism 5 is moved in the direction perpendicular to the substrate S (Z direction) by the difference in height between the substrate recognition first mark AS1 and the chip recognition first mark AC1.

In the state in FIGS. 4A and 4B, the XY position information of the image capture unit 50 is stored in the control unit 10. Also, the control unit 10 controls the imaging means 53 to image the chip recognition first mark AC1 in a focused state, finds the XY position information about the chip recognition first mark AC1 in the field of view by using the image processing function, and stores this information.

Figure 5A:
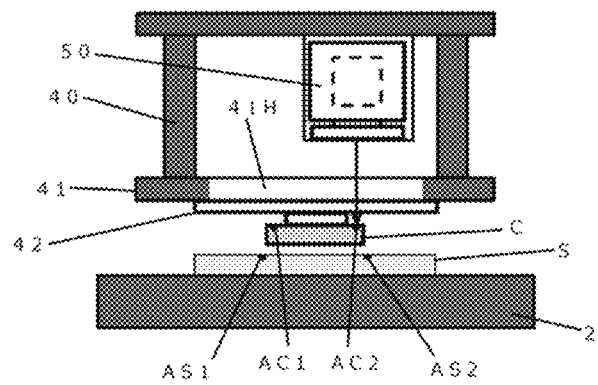
FIGS. 5A and 5B illustrate a state in which the mounting device according to an embodiment of the present disclosure acquires position information about a chip second recognition mark during the positioning of a chip component and a substrate.
Figure 5B:
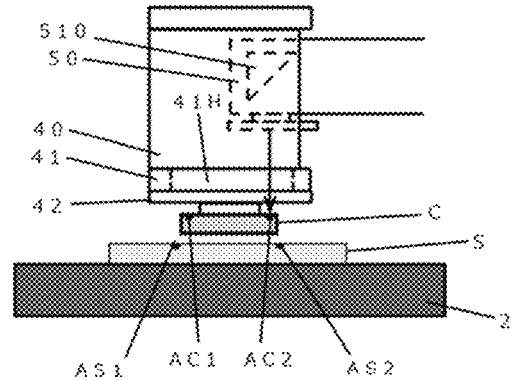

Next, the control unit 10 controls the drive means (i.e., the electronic actuator or motor) of the recognition mechanism 5 to move the recognition mechanism 5 within the XY plane so that the chip recognition second mark AC2 will be located near the center of the field of view of the image capture unit 50 as shown in FIGS. 5A and 5B. During this time, since the distance from the image capture unit 50 to the chip recognition second mark AC2 is the same as the distance to the chip recognition first mark AC1, there is no need to move the recognition mechanism 5 is in the direction perpendicular to the substrate S (Z direction) for focal adjustment.

In the state in FIGS. 5A and 5B, the XY position information of the image capture unit 50 is stored in the control unit 10. Also, the control unit 10 controls the imaging means 53 to image the chip recognition second mark AC2 in a focused state, finds the XY position information about the chip recognition second mark AC2 in the field of view by using the image processing function, and stores this information.

Figure 6A:
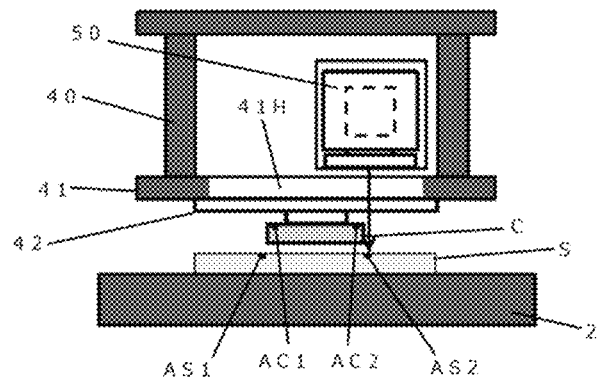
FIGS. 6A and 6B illustrate a state in which the mounting device according to an embodiment of the present disclosure acquires position information about a substrate second recognition mark during the positioning of a chip component and a substrate.
Figure 6B:
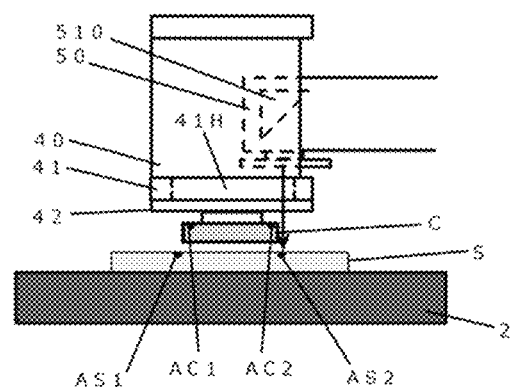

After this, the control unit 10 controls the drive means (i.e., the electronic actuator or motor) of the recognition mechanism 5 to move the recognition mechanism 5 within the XY plane so that the substrate recognition second mark AS2 will be positioned near the center of the field of view of the image capture unit 50, as shown in FIGS. 6A and 6B. During this time, the recognition mechanism 5 is moved in the direction perpendicular to the substrate S (Z direction) by the difference in height between the chip recognition second mark AC2 and the substrate recognition second mark AS2 in order to focus the image.

In the state in FIGS. 6A and 6B, the XY position information of the image capture unit 50 is stored in the control unit 10. Also, the control unit 10 controls the imaging means 53 to capture a focused image of the substrate recognition second mark AS2, finds the XY position information about the substrate recognition second mark AS2 in the field of view by using the image processing function, and stores this information.

As described above, in this embodiment, the relative positional relationship between the substrate recognition marks and the chip recognition marks can be obtained from the XY position information about the recognition mechanism 5 and the XY position information about the recognition marks in the field of view of the image acquired by the imaging means 53. Also, since the position information is obtained by imaging and recognizing the individual substrate recognition marks and chip recognition marks in a focused state, very accurate position information can be obtained.

The control unit 10 calculates the amount of misalignment between the substrate S and the chip component C from the relative position information obtained above.

After this, the control unit 10 calculates the correction movement amount of the substrate S and the chip component C within the substrate plane in order to correct this misalignment, and drives the substrate stage 2 and/or the mounting head 4 within the substrate plane to perform positioning so that the amount of misalignment between the substrate S and the chip component C falls within the permissible range.

After the positioning of the substrate S and the chip component C is complete, the mounting step is begun. In the mounting step, the control unit 10 lowers the mounting head 4, brings the chip component C into close contact with the substrate S, and mounts the chip component C with a specific pressing force. During this time, the chip component C is fixed to the substrate S by heating the thermosetting adhesive between the substrate S and the chip component C with the heater portion 41 of the mounting head 4. After pressing and heating for a specific length of time, the mounting head 4 releases its suction hold of the chip component C and rises, and the mounting step is completed.

Figure 7A:
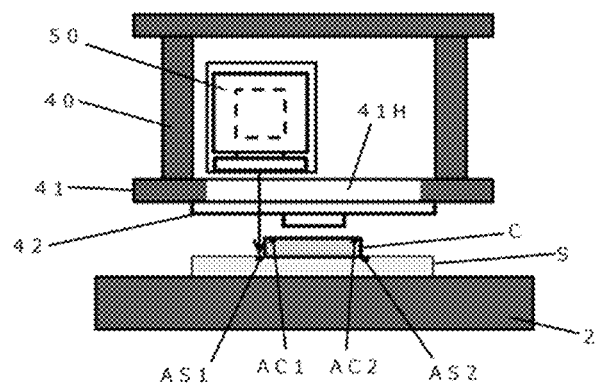
FIGS. 7A and 7B illustrate measurement of mounting accuracy after completion of the mounting step of mounting a chip component on a substrate with the mounting device according to an embodiment of the present disclosure.
Figure 7B:
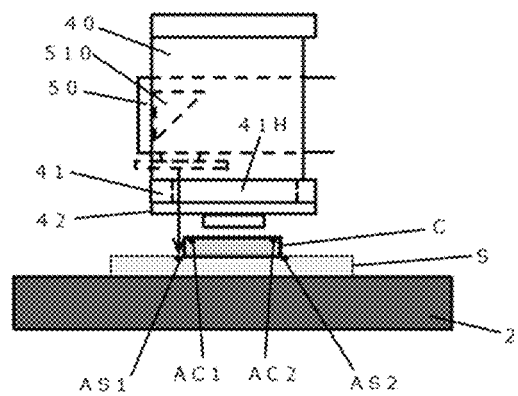

Incidentally, from the standpoint of quality control, it is required to perform measurement and inspection of the accuracy of all mounting positions after the completion of the mounting step. However, measuring the mounting position accuracy with a separate device after the mounting step is completed drives up the cost. Also, if there is a problem with the mounting position accuracy, it takes time to notice this, so corrective action is delayed. In view of this, as shown in FIGS. 7A and 7B, just as in the positioning step, after the mounting step is complete, a function is added by which the recognition mechanism 5 of the mounting device 1 is used to obtain position information about the substrate recognition first mark AS1 and the chip recognition first mark AC1, and position information about the substrate recognition second mark AS2 and the chip recognition second mark AC2, and the mounting position accuracy is found in a state in which the chip component C has been mounted on the substrate S. This method does not require any device separate from the mounting device, and does not increase the cost.

However, the using the recognition mechanism 5 of the mounting device 1 to measure and inspect the mounting position accuracy after completion of the mounting step increases the duration of the operation of mounting position accuracy measurement, so this leads to a marked drop in productivity, particularly when measuring and inspecting the accuracy of all mounting positions.

In view of this, with the present disclosure, attention is turned to a configuration with which the chip recognition marks and the substrate recognition marks can be recognized through the mounting head 4, and to determining the positional relationship between the substrate S and the chip component C at the stage when the chip component C is in close contact with the substrate S, and the mounting position accuracy can also be measured and inspected by obtaining position information about each of the substrate recognition marks and the chip recognition marks at a stage during the mounting step. That is, the chip component C held by the mounting head 4 and pressed against the substrate S that is held by the substrate stage 2 is fixed at the stage of being in close contact with the substrate S, and only when this state is maintained by adhesive curing, the measurement and inspection of mounting position accuracy is begun at a stage during the mounting step, with both steps being performed in parallel, which allows mounting accuracy measurement and inspection to be performed for all the marks without increasing the cost or decreasing the productivity.

Figure 8A:
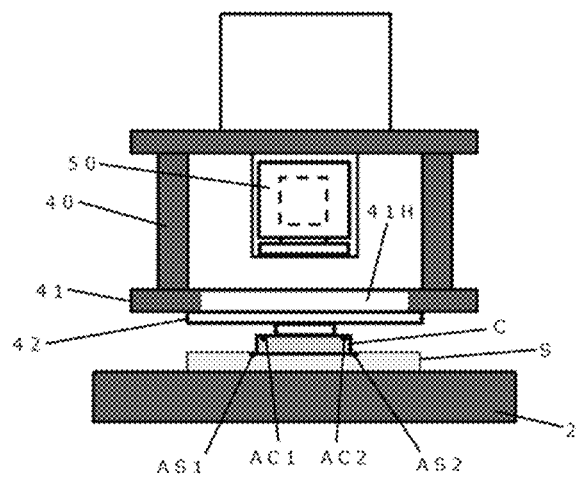
FIGS. 8A and 8B illustrate a state in which the mounting head is lowered and the chip component is in close contact with the substrate in the mounting step of mounting a chip component on a substrate with the mounting device according to the embodiment of the present disclosure.
Figure 8B:
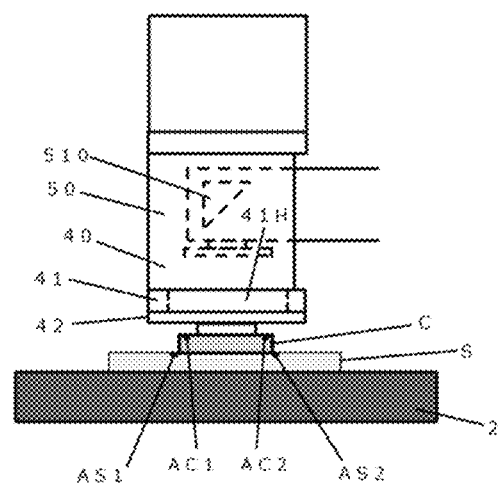
Figure 11A:
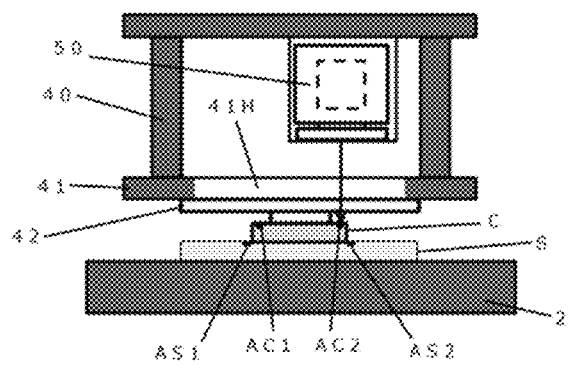
FIGS. 11A and 11B illustrate the measurement of mounting accuracy in a state where the mounting head is lowered and the chip component is in close contact with the substrate in a mounting step of mounting a chip component on a substrate with the mounting device according to the embodiment of the present disclosure, and show a state in which position information about a chip second recognition mark is being acquired.
Figure 11B:
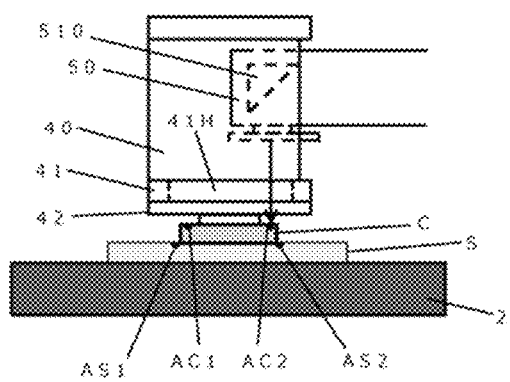
Figure 12A:
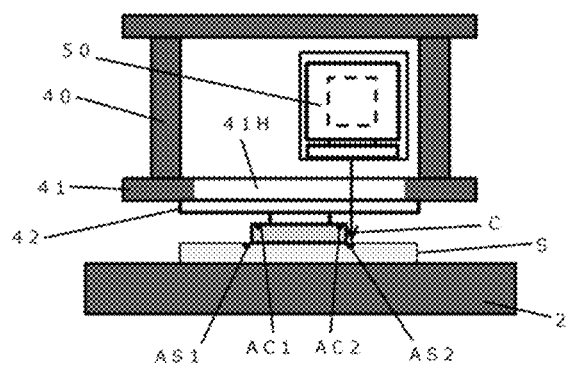
FIGS. 12A and 12B illustrate the measurement of mounting accuracy in a state where the mounting head is lowered and the chip component is in close contact with the substrate in a mounting step of mounting a chip component on a substrate with the mounting device according to the embodiment of the present disclosure, and show a state in which position information about a substrate second recognition mark is being acquired.
Figure 12B:
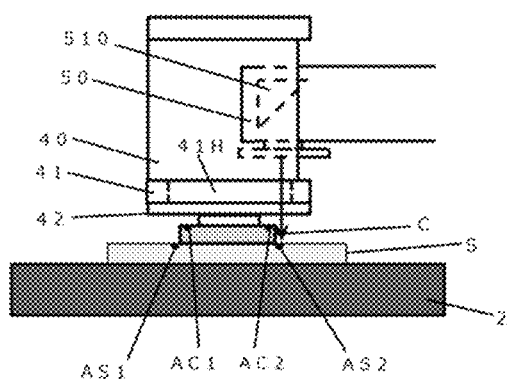

An embodiment in which the mounting position accuracy is measured in parallel with the mounting step using the mounting device 1 will now be described. FIGS. 8A and 8B show a state in which the mounting device 1 lowers the mounting head 4 in the mounting step to bring the chip component C into close contact with the substrate S. The mounting accuracy measurement and inspection step in this embodiment can be commenced immediately after the mounting head 4 is lowered and the chip component C is brought into close contact with the substrate S. Here, whether or not the chip component C is in close contact with the substrate S can be determined by a pressure sensor, a displacement sensor, or the like (not shown).

FIGS. 9A and 9B show a process in which the mounting device 1 acquires position information about the substrate recognition first mark AS1 of the substrate S in the mounting step in which the chip component C is brought into close contact with the substrate S, and the operation of the recognition mechanism 5 is the same as that in the positioning step shown in FIGS. 3A and 3B.

The operation of the subsequent mounting accuracy measurement and inspection step is the same as that of the positioning step, as shown in FIGS. 10A, 10B, 11A, 11B, 12A and 12B, and involves finding the mounting position accuracy from the relative positional relationship between the substrate recognition first mark AS1 and the chip recognition first mark AC1, and the relative positional relationship between the substrate recognition second mark AS2 and the chip recognition second mark AC2, obtained in the states of FIGS. 9A, 9B, 10A, 10B, 11A, 11B, 12A and 12B. That is, the control unit 10 calculates the mounting position accuracy of the chip component C with respect to the substrate S by comparing the position information obtained when the component C is accurately mounted at the specified position of the substrate S to that actually obtained by recognition using the recognition mechanism 5, for the relative positional relationship between the substrate recognition first mark AS1 and the chip recognition first mark AC1 and the positional relationship between the substrate recognition second mark AS2 and the chip recognition second mark AC2.

In the positioning step in FIGS. 3A, 3B, 4A, 4B, 5A, 5B, 6A and 6B, the recognition mechanism 5 ends in a state of recognizing the substrate recognition second mark AS2, so it is most efficient to begin the mounting position accuracy measurement and inspection step from the substrate recognition second mark AS2. Also, since the recognition mechanism 5 is independent from the mounting head 4, even if the mounting head 4 is lowered between the positioning step and the mounting step, there is no change at all in the positional relationship between the image capture unit 50 and the substrate recognition second mark AS2, so no focal adjustment is required.

If the mounting accuracy measurement and inspection step takes longer than the mounting step, the mounting head 4 will rise during the mounting accuracy measurement and inspection step, but since the recognition mechanism 5 is independent from the mounting head 4, there is no change at all in the distance from the image capture unit 50 to each of the recognition targets, so the operation of the recognition mechanism 5 is not affected by the position of the mounting head 4. That is, if the duration of the mounting step (the time from immediately after when the mounting head 4 is lowered and the chip component C is brought into close contact with the substrate S until the mounting head 4 is completely raised) is greater than or equal to the duration of the mounting position accuracy measurement and inspection step, it will be possible to measure and inspect all mounting positions without a decrease in productivity.

Incidentally, in a state in which the chip component C is in close contact with the substrate S, the gap D in FIG. 2 is at zero, and the height difference between the substrate recognition marks and the chip recognition marks in the up and down direction is the "thickness TC of the chip component C." That is, as the chip thickness TC decreases, the height difference between the substrate recognition marks and the chip recognition marks in the vertical direction also decreases. Here, if the height difference between the substrate recognition marks and the chip recognition marks in the vertical direction is within the depth of field of the imaging means 53, this means that the substrate recognition first mark AS1 and the chip recognition first mark AC1 can both be imaged clearly and simultaneously as shown in FIG. 13.

That is, if the chip thickness TC is small and the height difference in the vertical direction between the substrate recognition marks and the chip recognition marks in a mounted state is within the depth of field of the imaging means 53, as shown in FIGS. 14A and 14B, the image capture unit 50 can be put in a position near the midpoint between the substrate recognition first mark AS1 and the chip recognition first mark AC1, and the imaging means 53 can simultaneously image and recognize both recognition marks within the depth of focus and within the same visual field. Furthermore, as shown in FIGS. 15A and 15B, if the substrate recognition second mark A2 and the chip recognition second mark AC2 are also imaged and recognized at the same time, the number of times an image is captured can be halved, so the time required for the mounting position accuracy measurement and inspection step can be greatly reduced. Therefore, the result of adding this function is that the duration of the mounting step (the time from immediately after when the mounting head 4 is lowered and the chip component C is brought into close contact with the substrate S until the mounting head 4 is completely raised) is greater than or equal to the duration of the mounting position accuracy measurement and inspection step, and it will be highly probable that mounting position accuracy measurement and inspection can be performed for all the marks without a decrease in productivity.

If it is possible to find the mounting position accuracy during the mounting step by using the imaging means 53, then it is also possible to perform calibration calculation of the shift in the mounting position attributable to a change in the inclination of the optical axis or a change in the optical axis position of the imaging means 53 due to environmental changes, a change in the inclination of the elevating and pressing unit 3, or the like. That is, in the positioning step in which the imaging means 53 images the substrate recognition marks and the chip recognition marks and positioning is performed, even if the amount of misalignment in the calculation result is within the allowable range, if there is misalignment in the mounting position accuracy measurement result in which the imaging means 53 is used, then it will be easy to determine that there has been a change in the optical axis position or the optical axis inclination of the imaging means 53, or a change in the inclination of the elevating and pressing unit 3, and by automatically performing a constant calibration calculation, it always will be possible to mount stably, within the permissible range of the specified position, without shifting the mounting position of the chip component C with respect to the substrate S.

It is thus possible to perform extremely stable and highly accurate mounting, without an attendant rise in cost or decrease in production capacity, by calculating the mounting position accuracy at a stage during the mounting step, feeding this result back to the mounting position, and constantly and automatically calibrating and adjusting the mounting position.

Figure 19A:
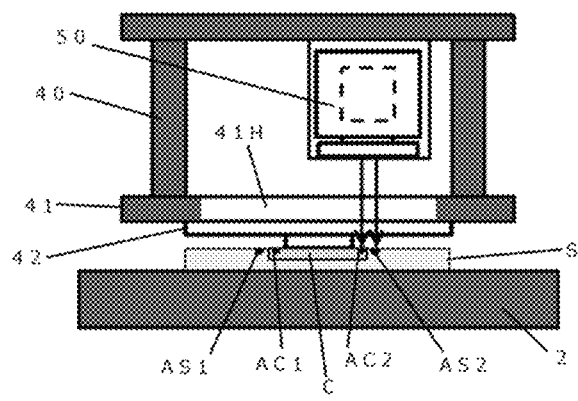
FIGS. 19A and 19B illustrate mounting accuracy measurement in a state where the mounting head is lowered and the chip component is in close contact with the substrate in the mounting step of mounting a chip component on an embedded substrate with the mounting device according to an embodiment of the present disclosure, and show a state in which position information about the substrate second recognition mark and the chip second recognition mark are acquired simultaneously.
Figure 19B:
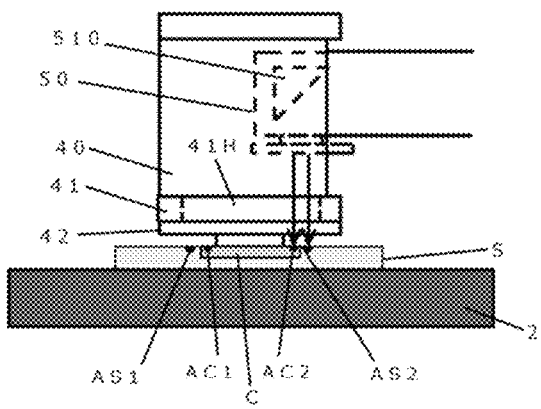

In particular, in the mounting of the chip component C on a component-embedded substrate, the function of simultaneously imaging the substrate recognition marks and the chip recognition marks within the depth of focus and within the same field is extremely effective. That is, when the chip component C is mounted in a recess SC of the substrate S having this recess SC as shown in FIGS. 16A, 17A and 17B, the upper surface of the substrate S and the upper surface of the chip component C are substantially flush, as shown in FIG. 16B. Therefore, as shown in FIGS. 18A and 18B, the distances from the image capture unit 50 of the recognition mechanism to the substrate recognition first mark AS1 and to the chip recognition first mark AC1 are substantially the same vertical distance, and it will be easy to image both recognition marks simultaneously, in a focused state, and within the same field of view. This also applies to when the substrate recognition second mark A2 and the chip recognition second mark AC2 shown in FIGS. 19A and 19B are imaged.

Also, if the upper surface of the substrate S and the upper surface of the chip component C are flush, there will be zero height difference in the up and down direction between the substrate recognition marks and the chip recognition marks, and a clearer image can be acquired, so this is also ideal for the function of ascertaining the change in the optical axis position and the optical axis inclination of the imaging means 53, the change in the inclination of the elevating and pressing unit 3, and so forth, and automatically and constantly performing calibration and adjustment of the mounting position. Furthermore, it is possible to realize a mounting device that affords good stability, high reliability, and high accuracy.

Incidentally, in the embodiment described above, since the attachment tool 42 is formed by a transparent member, the chip recognition marks and the substrate recognition marks can be observed through the mounting head 4, but accurate mounting requires a high-quality transparent member. That is, if the transparent member has optical defects or a geometrical tolerance, slight errors will occur in the position information due to image blurring, image distortion, refractive index change, and the like. Here, the optical defects include minute voids, impurities, thermal deformation, and so forth, while geometrical tolerances include surface roughness, dimensional tolerance, parallelism, and so forth. Therefore, when the attachment tool 42 is constituted by a transparent member, in order to support high-precision (specifically, submicron-precision) positioning, the transparent member needs to be a high-quality member with few optical defects and geometrical tolerances, that is, an expensive member.

Figure 20A:
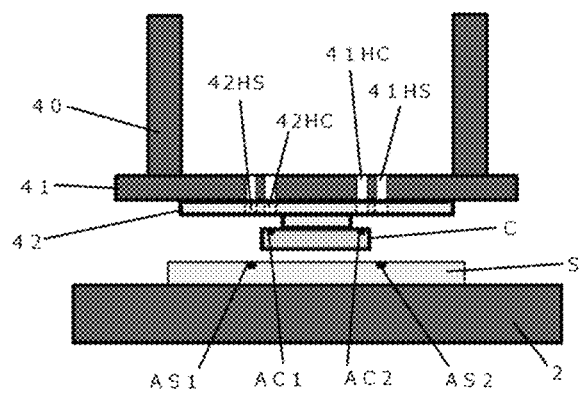
FIGS. 20A and 20B illustrate a through-hole for positioning a chip component and a substrate in a modification example of an embodiment of the present disclosure, with FIG. 20A being an example where through-holes in a heater unit and an attachment tool are provided so as to match up with the positions of the individual recognition marks, and FIG. 20B being an example where a through-hole in the attachment tool is provided corresponding to the entire specification dimensional range, and in a shape that encompasses nearby recognition marks.
Figure 20B:
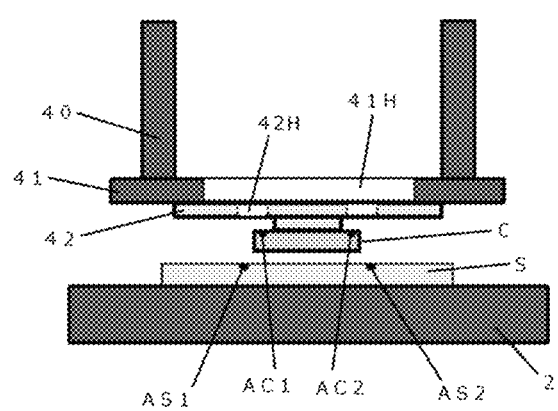
Figure 21A:
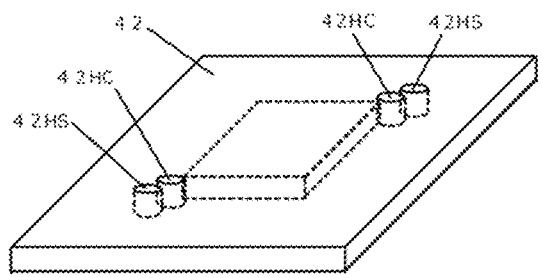
FIGS. 21A and 21B illustrate a through-hole provided to the attachment tool, in a modification example of an embodiment of the present disclosure, with FIG. 21A being an example where through-holes are provided so as to match up with the positions of the individual recognition marks, and FIG. 21B being an example where a through-hole is provided in a shape that encompasses nearby recognition marks.
Figure 21B:
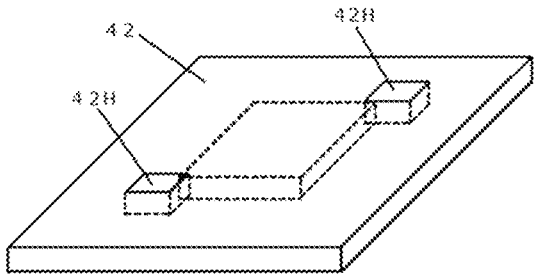
Figure 22A:
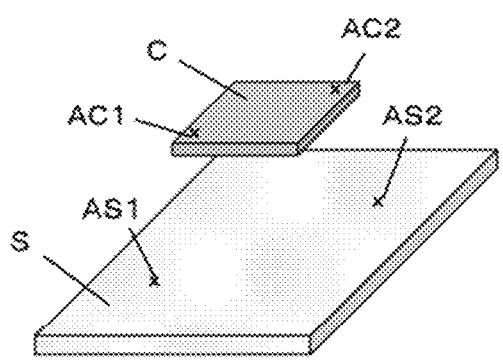
FIGS. 22A and 22B illustrate face-up mounting, with FIG. 22A showing a state in which a chip component is separated from a substrate, and FIG. 22B showing a state in which the chip component is positioned and mounted on the substrate.
Figure 22B:
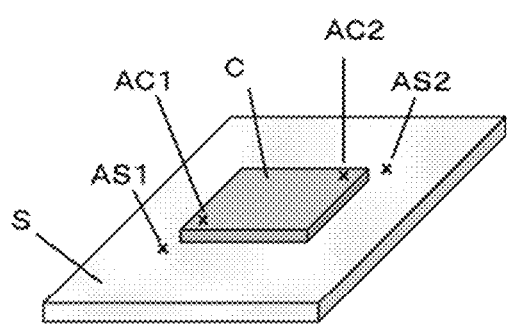

In view of this, as another embodiment of the present disclosure, FIGS. 20A and 20B show the configuration of an attachment tool 42 capable of positioning with submicron precision at a relatively low cost. The attachment tool 42 in FIGS. 20A and 20B is provided with a through-hole that allows the substrate recognition marks and the chip recognition marks to be observed. In FIG. 20A, through-holes corresponding to the various recognition marks are provided, and in FIG. 20B, a through-hole having a shape that encompasses both the substrate recognition marks and the chip recognition marks, which are close to each other, is provided. FIGS. 21A and 21B show just the attachment tools 42 corresponding to FIGS. 20A and 20B. In FIG. 21A, through-holes 42HS aligned with the positions of the substrate recognition marks, and through-holes 42HC aligned with the positions of the chip recognition marks are separately provided. In FIG. 21B, a through-hole 42H having a shape that encompasses both the substrate recognition marks and the chip recognition marks, which are close to each other, is provided.

Here, the heater unit 41 can also be provided to be aligned with the positions of the individual substrate recognition marks and chip recognition marks, an example of which is shown in FIG. 20A. In FIG. 20A, the heater unit 41 is separately provided with through-holes 41HS aligned with the positions of the substrate recognition marks, and through-holes 41HC aligned with the positions of the chip recognition marks.

Even when the attachment tool 42 is provided with a through-hole, it is still preferable for the attachment tool 42 to be translucent. If the attachment tool 42 does not transmit light, in the example of FIG. 20B, the chip recognition first mark AC1, the chip recognition second mark AC2, the substrate recognition first mark AS1, and the substrate recognition second mark AS2 will be imaged only with the light passing through the through-hole 42H, so there will not be enough light, making it difficult to obtain a clear image, and as a result, the positioning accuracy will be adversely affected. On the other hand, if the attachment tool 42 is translucent, then in addition to the light passing through the through-hole 42H, light will also be obtained from the periphery around the inner wall of the through-hole 42H, making it easier to obtain enough light to obtain a clear image. Furthermore, since an image that has passed through the through-hole 42H is obtained, a clear image can be obtained without being affected by any optical defects or geometrical tolerance of the member of the attachment tool 42.

By the way, the light transmission required of the attachment tool 42 does not mean general transparency, as long as it allows the brightness of the light to be transmitted, even though there may be some turbidity due to refraction or scattering of light. Accordingly, the material is not limited to glass or quartz, and may instead be a translucent ceramic such as alumina. However, in order to transmit enough light for the chip recognition marks and the substrate recognition marks to be clearly and accurately imaged, a material that has a transmittance of at least 50% of visible light and infrared light at a thickness of 1 mm is preferable, and a material with a transmittance of at least 80% of visible light or infrared light is even better.

The above configuration in which a translucent attachment tool is provided with a through-hole makes possible positioning with submicron precision in the mounting device 1 shown in FIGS. 1A and 1B, but may be applied to a mounting device with a different configuration from that of the mounting device 1. Providing a translucent material with a through-hole allows for imaging that is equivalent to or better than that when using an expensive transparent material, but at a relatively low cost, so mounting accuracy is improved even in the case of not performing mounting accuracy calculation during mounting as is done in the mounting device 1.

In understanding the scope of the present invention, the term "comprising" and its derivatives, as used herein, are intended to be open ended terms that specify the presence of the stated features, elements, components, groups, integers, and/or steps, but do not exclude the presence of other unstated features, elements, components, groups, integers and/or steps. The foregoing also applies to words having similar meanings such as the terms, "including", "having" and their derivatives. Also, the terms "part," "section," "portion," "member" or "element" when used in the singular can have the dual meaning of a single part or a plurality of parts unless otherwise stated.

While only selected embodiments have been chosen to illustrate the present invention, it will be apparent to those skilled in the art from this disclosure that various changes and modifications can be made herein without departing from the scope of the invention as defined in the appended claims. For example, unless specifically stated otherwise, the size, shape, location or orientation of the various components can be changed as needed and/or desired so long as the changes do not substantially affect their intended function. Unless specifically stated otherwise, components that are shown directly connected or contacting each other can have intermediate structures disposed between them so long as the changes do not substantially affect their intended function. The functions of one element can be performed by two, and vice versa unless specifically stated otherwise. The structures and functions of one embodiment can be adopted in another embodiment. It is not necessary for all advantages to be present in a particular embodiment at the same time. Every feature which is unique from the prior art, alone or in combination with other features, also should be considered a separate description of further inventions by the applicant, including the structural and/or functional concepts embodied by such feature(s). Thus, the foregoing descriptions of the embodiments according to the present invention are provided for illustration only, and not for the purpose of limiting the invention as defined by the appended claims and their equivalents.

What is claimed is:

1. A mounting device for face-up mounting of a chip component having a positioning-use chip recognition mark and a substrate having a positioning-use substrate recognition mark, in an orientation in which the chip recognition mark and the substrate recognition mark are facing up, the mounting device comprising:
- a substrate stage configured to hold the substrate;
- a mounting head configured to hold the chip component;
- an elevator configured to raise and lower the mounting head in a direction perpendicular to the substrate;
- a recognition mechanism configured to recognize the chip recognition mark and the substrate recognition mark through the mounting head and from above the mounting head, the recognition mechanism being movable in an in-plane direction of a substrate surface of the substrate; and
- a control unit connected to the recognition mechanism, the control unit being configured to calculate an amount of misalignment between the chip component and the substrate from position information about the chip recognition mark and the substrate recognition mark obtained from the recognition mechanism, and configured to perform positioning by driving the mounting head and/or the substrate stage according to the amount of misalignment,
- after lowering the mounting head holding the chip component in the direction perpendicular to the substrate to bring the chip component into close contact with the substrate subsequent to positioning the chip component and the substrate by the recognition mechanism, the control unit being configured to cause the recognition mechanism to start a parallel recognition operation of the chip recognition mark and the substrate recognition mark and recognize the chip recognition mark and the substrate recognition mark through the mounting head in a mounted state in which the chip component is in close contact with the substrate, and configured to calculate mounting position accuracy of the chip component and the substrate.

2. The mounting device according to claim 1, wherein during the parallel recognition operation of the chip recognition mark and the substrate recognition mark through the mounting head for calculating the mounting position accuracy that has been started after the chip component is brought into close contact with the substrate, the recognition mechanism is configured to simultaneously recognize the chip recognition mark and the substrate recognition mark while a center of an optical axis of the recognition mechanism is disposed at a position near a midpoint between the chip recognition mark and the substrate recognition mark.

3. The mounting device according to claim 2, wherein the control unit is configured to feed back a calculation result of the mounting position accuracy to a mounting position to automatically calibrate and adjust the mounting position.

4. A mounting device for face-up mounting of a chip component having a positioning-use chip recognition mark and a substrate having a positioning-use substrate recognition mark, in an orientation in which the chip recognition mark and the substrate recognition mark are facing up, the mounting device comprising:
- a substrate stage configured to hold the substrate;
- a mounting head configured to hold the chip component and press-bonds the chip component to the substrate;
- an elevator configured to raise and lower the mounting head in a direction perpendicular to the substrate; and
- a recognition mechanism configured to recognize the chip recognition mark and the substrate recognition mark through the mounting head and from above the mounting head, the recognition mechanism being movable in an in-plane direction of a substrate surface of the substrate,
- the mounting head having a chip holding unit that is configured to hold the chip component and is made of a translucent material, the chip holding unit having a through-hole for recognizing the chip recognition mark and the substrate recognition mark.

5. The mounting device according to claim 4, wherein the chip holding unit is made of glass or ceramic and has a transmittance of visible light and infrared light of at least 50% at a thickness of 1 mm.

6. A mounting method in which a chip component having a positioning-use chip recognition mark is mounted on a substrate having a positioning-use substrate recognition mark, the method comprising:
- positioning relative positional relation between the chip component and the substrate by recognizing, in a state where the chip component is disposed with a gap between itself and the substrate, the chip recognition mark and the substrate recognition mark from a same direction through a mounting head;
- mounting by bringing the chip component into close contact with the substrate and pressing; and
- measuring and inspecting mounting position accuracy by recognizing, in a mounted state in which the chip component is in close contact with the substrate, the chip recognition mark and the substrate recognition mark from the same direction through the mounting head, and by calculating the relative positional relation between the chip component and the substrate,
- after the chip component is in close contact with the substrate, the mounting and the measuring and inspecting of the mounting position accuracy being performed in parallel.

7. The mounting method according to claim 6, wherein during the measuring and inspecting of the mounting position accuracy, the chip recognition mark and the substrate recognition mark are simultaneously recognized while a center of an optical axis of a recognition mechanism is disposed at a position near a midpoint between the chip recognition mark and the substrate recognition mark.

8. The mounting method according to claim 7, further comprising
feeding back a calculation result of the mounting position accuracy calculated during the measuring and inspecting of the mounting position accuracy to a mounting position to automatically calibrate and adjust the mounting position.

* * * * *